United States Patent
Belady et al.

(10) Patent No.: US 6,873,530 B2
(45) Date of Patent: Mar. 29, 2005

(54) STACK UP ASSEMBLY

(75) Inventors: Christian L. Belady, McKinney, TX (US); Shaun L. Harris, McKinney, TX (US); Gary Wayne Williams, Rowlett, TX (US); Brent A. Boudreaux, Highland Village, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/890,937

(22) Filed: Jul. 13, 2004

(65) Prior Publication Data

US 2004/0257773 A1 Dec. 23, 2004

Related U.S. Application Data

(60) Division of application No. 10/425,548, filed on Apr. 28, 2003, now Pat. No. 6,816,378, which is a continuation-in-part of application No. 10/425,491, filed on Apr. 28, 2003, now Pat. No. 6,807,061.

(51) Int. Cl.[7] .............................................. H05K 7/20
(52) U.S. Cl. ........................ 361/719; 361/720; 361/718; 361/717; 361/710; 257/707; 257/712; 257/713
(58) Field of Search ................................ 361/709, 702, 361/703, 704, 707, 710–722, 728; 257/706, 707, 712–724; 454/184–186; 312/236

(56) References Cited

U.S. PATENT DOCUMENTS

| | | | | |
|---|---|---|---|---|
| 4,965,710 A | * | 10/1990 | Pelly et al. | 363/56.03 |
| 5,023,752 A | * | 6/1991 | Detter et al. | 361/752 |
| 5,390,078 A | * | 2/1995 | Taylor | 361/721 |
| 5,424,919 A | * | 6/1995 | Hielbronner | 361/710 |
| 5,548,090 A | * | 8/1996 | Harris | 174/252 |
| 5,586,006 A | * | 12/1996 | Seyama et al. | 361/719 |
| 5,587,882 A | * | 12/1996 | Patel | 361/705 |
| 5,734,555 A | * | 3/1998 | McMahon | 361/704 |
| 5,742,477 A | * | 4/1998 | Baba | 361/704 |
| 5,862,038 A | * | 1/1999 | Suzuki et al. | 361/704 |
| 5,930,115 A | * | 7/1999 | Tracy et al. | 361/704 |
| 5,986,887 A | * | 11/1999 | Smith et al. | 361/704 |
| 6,058,013 A | * | 5/2000 | Christopher et al. | 361/704 |
| 6,239,366 B1 | * | 5/2001 | Hsuan et al. | 174/52.3 |
| 6,256,201 B1 | * | 7/2001 | Ikeda et al. | 361/704 |
| 6,269,866 B1 | * | 8/2001 | Yamamoto et al. | 165/104.26 |
| 6,414,867 B2 | * | 7/2002 | Suzuki et al. | 363/141 |
| 6,462,410 B1 | * | 10/2002 | Novotny et al. | 257/707 |
| 6,483,704 B2 | * | 11/2002 | Ulen et al. | 361/704 |
| 6,490,161 B1 | * | 12/2002 | Johnson | 361/704 |
| 6,621,701 B2 | * | 9/2003 | Tamba et al. | 361/699 |
| 6,771,507 B1 | * | 8/2004 | Belady et al. | 361/704 |
| 2002/0036889 A1 | * | 3/2002 | Ruiz-Gomez et al. | 361/695 |

FOREIGN PATENT DOCUMENTS

| | | | | | |
|---|---|---|---|---|---|
| JP | 2004063604 A | * | 2/2004 | | H01L/25/07 |
| JP | 2004140159 A | * | 5/2004 | | H01L/23/36 |

* cited by examiner

*Primary Examiner*—Anatoly Vortman
(74) *Attorney, Agent, or Firm*—Leslie P. Gehman

(57) ABSTRACT

A first printed circuit board is built including one or more openings configured to correspond to heat-generating devices attached to a second printed circuit board. The first and second printed circuit boards are aligned with each other and a heat sink, such that the heat sink is thermally coupled with heat-generating electronic devices on both the first and second printed circuit boards. Heat-generating devices are thermally coupled with a thermal pad on one or more of the printed circuit boards. The thermal pad is then thermally coupled with the heat sink. Optionally, the first and second printed circuit boards may be electrically coupled with each other through an electrical connector.

16 Claims, 10 Drawing Sheets

Section A-A

Section B-B

Section C-C

STACK UP ASSEMBLY

CROSS-REFERENCE TO RELATED APPLICATIONS

This application is a divisional of application Ser. No. 10/425,548 also entitled, "Stack Up Assembly," filed on Apr. 28, 2003 hereby incorporated herein by reference. Application Ser. No. 10/425,548 entitled, "Stack Up Assembly," filed on Apr. 28, 2003, now U.S. Pat. No. 6,816,378 is a continuation-in-part of application Ser. No. 10/425,491 also entitled, "Stack Up Assembly," filed on Apr. 28, 2003, now U.S. Pat. No. 6,807,061, and also hereby incorporated herein by reference.

FIELD OF THE INVENTION

The present invention relates generally to the field of heat sinks and more specifically to the field of heat sinks configured to conduct heat from heat-generating devices on two or more different printed circuit boards.

BACKGROUND OF THE INVENTION

Modern electronics have benefited from the ability to fabricate devices on a smaller and smaller scale. As the ability to shrink devices has improved, so has their performance. Unfortunately, this improvement in performance is accompanied by an increase in power as well as power density in devices, resulting in large amounts of heat. In order to maintain the reliability of these devices, the industry must find new methods to remove this heat efficiently.

Many current systems include a plurality of printed circuit boards. These boards may each include a plurality of heat-generating devices requiring cooling to remain within their operating temperatures. Some commonly available current systems configure the printed circuit boards such that they are parallel with each other and then force airflow across the printed circuit boards, thus cooling the heat-generating devices attached to the printed circuit boards. The individual heat-generating devices may include heat sinks to make more efficient use of the heat transfer properties of the airflow. However, as devices shrink in size and heat generation increases, standard techniques such as individual heat sinks and wide gaps between parallel printed circuit boards are no longer sufficient to provide the compact size required of many devices today.

Some printed circuit boards and their devices are configured to allow the use of a single heat sink across a plurality of individual heat-generating devices. This allows the use of larger heat sinks that are more efficient and cheaper and easier to manufacture than a plurality of individual heat sinks. Often, two printed circuit boards contain devices with functions that must be closely mated for optimal performance. For example, a power module board is most effective when it is as close as possible to the printed circuit board including the ASICs or microprocessors to which the power module board is supplying power. This closeness reduces voltage drops along the, now shortened, interconnect between the power module and the ASICs or microprocessors. Typically, devices on both the power module board and the microprocessor printed circuit board require heat sinks to efficiently dissipate the heat generated by the electronic devices on those boards. One technique involves placing the power module board and the printed circuit board back-to-back with their heat sinks facing outwards from the two boards. However, this technique results in a system requiring two airflows over the two sets of heat sinks for efficient cooling. This requirement causes the overall volume of the completed device to increase, along with the cost of providing two airflows. Similarly, when a single printed circuit board is used and the power module is placed on the opposing side of the printed circuit board, two sets of heat sinks and two airflows are still required. Other configurations may place the power module components on the same side of a single printed circuit board with the other components, reducing the airflows required to one. However, this configuration may not allow the shortest possible power supply connections to the ASICs, microprocessors, or other devices.

SUMMARY OF THE INVENTION

A first printed circuit board is built including one or more openings configured to correspond to heat-generating devices attached to a second printed circuit board. The first and second printed circuit boards are aligned with each other and a heat sink, such that the heat sink is thermally coupled with heat-generating devices on both the first and second printed circuit boards. Within the scope of the present invention the heat sink may be a heat spreader, cold plate, refrigeration (evaporative cooling) plate, heat pipe or any other device configured to remove heat from the heat-generating devices. Heat-generating devices are thermally coupled with a thermal pad on one or more of the printed circuit boards. Optionally, the first and second printed circuit boards may be electrically coupled with each other through an electrical connector. Also optionally, heat-generating devices may be mechanically and electrically coupled with the second printed circuit board through interposers configured (upon assembly) to raise the heat-generating electronic devices through the openings in the first printed circuit board such that the upper surfaces of the heat-generating devices of the first and second circuit boards are substantially co-planar. Optionally, more than two printed circuit boards with any combination of openings, heat-generating devices and thermal pads may be used within the scope of the present invention.

Other aspects and advantages of the present invention will become apparent from the following detailed description, taken in conjunction with the accompanying drawings, illustrating by way of example the principles of the invention.

DETAILED DESCRIPTION

Figure 1A:
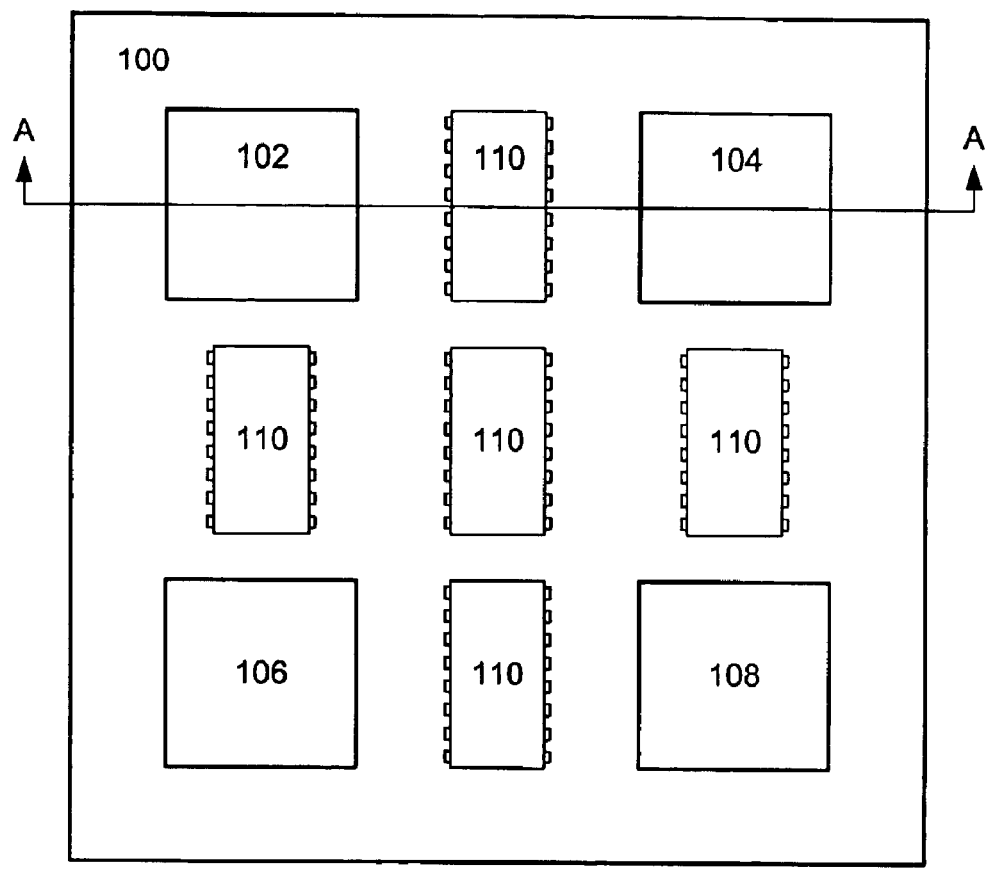
FIG. 1A is a top view of an example embodiment of a first printed circuit board including heat-generating devices according to the present invention.
Figure 5A:
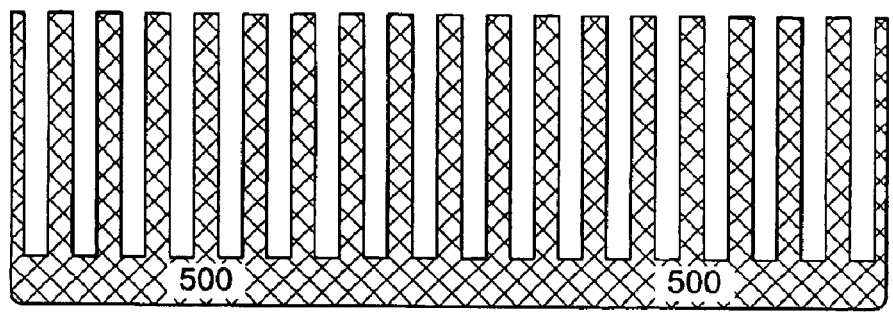
FIG. 5A is a cross-sectional view of an example stack up assembly before assembly of the example embodiments of first and second printed circuit boards from FIGS. 1 and 4 along with an example embodiment of a heat sink according to the present invention.
Figure 5A:
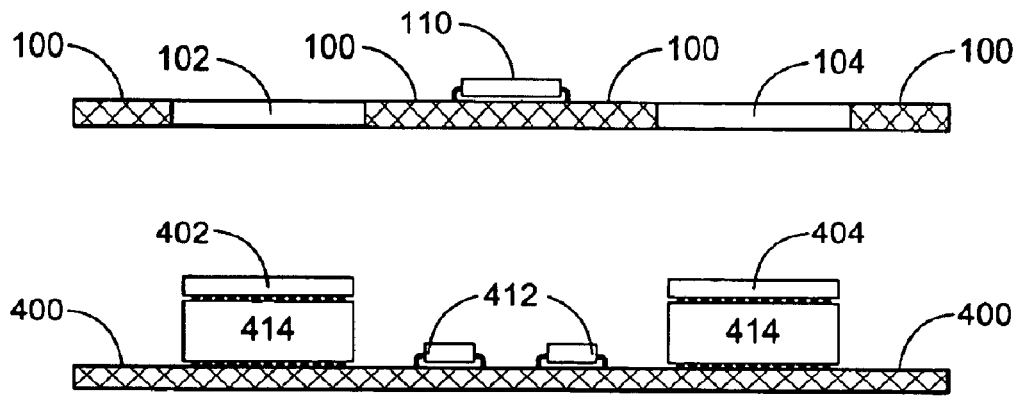
Figure 5B:
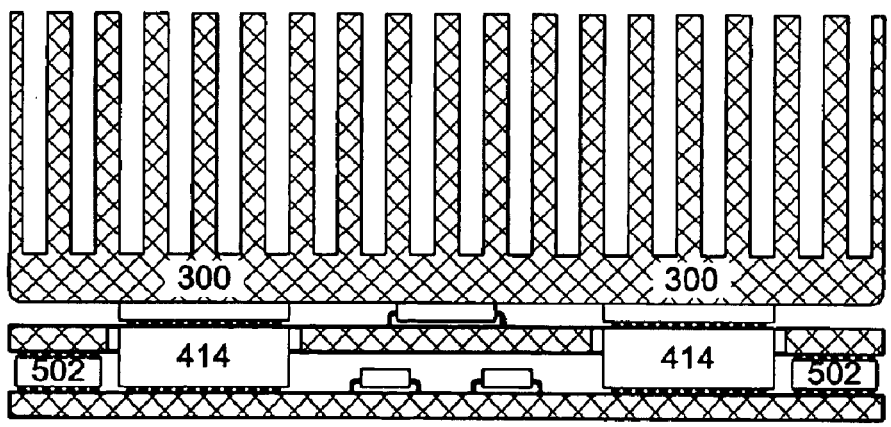
FIG. 5B is a cross-sectional view of an example stack up assembly after complete assembly of the example embodiments of first and second printed circuit boards from FIGS. 1 and 4 along with an example embodiment of a heat sink according to the present invention.

FIG. 1A is a top view of an example embodiment of a first printed circuit board including heat-generating devices according to the present invention. In this example embodiment of the present invention a first printed circuit board 100 including a first opening 102, a second opening 104, a third opening 106, and a fourth opening 108 is provided. Other embodiments of the present inventions may include any number of openings as needed for a particular implementation of the present invention. Also included on this first printed circuit board 100 are a number of first heat-generating devices 110. The terminology "first heat-generating devices" is used to distinguish these heat-generating devices on the first printed circuit board from those present on the second printed circuit board discussed below. As shown in FIGS. 5A and 5B, an upper surface of the first heat-generating devices may be substantially coplanar with an upper surface of the heat-generating devices on the second printed circuit board. While this example embodiment of the present invention included five first heat-generating devices 110, other embodiments may include any number of first heat-generating devices 110 as needed for a particular implementation of the present invention. These first heat-generating devices 110 may include electronic power circuits, application specific integrated circuits (ASICs), microprocessors, discrete electronic devices such as field effect transistors (FETs), other types of transistors, or other heat-generating devices as needed for a particular implementation of the present invention. In some embodiments of the present invention this first printed circuit board 100 may be a power module circuit board, a voltage regulation module (VRM) circuit board, or any other type of device as needed for a particular implementation of the present invention.

Figure 1B:
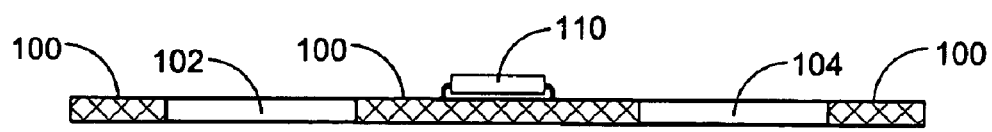
FIG. 1B is a cross-sectional view of the example embodiment of a first printed circuit board from FIG. 1A along section line A—A.

FIG. 1B is a cross-sectional view of the example embodiment of a first printed circuit board from FIG. 1A along section line A—A. In this example embodiment of the present invention, the first printed circuit board 100 is shown with a first opening 102, and a second opening 104. Also shown in this cross-sectional view is one of the upper heat-generating electronic devices 110 from FIG. 1A.

Figure 2A:
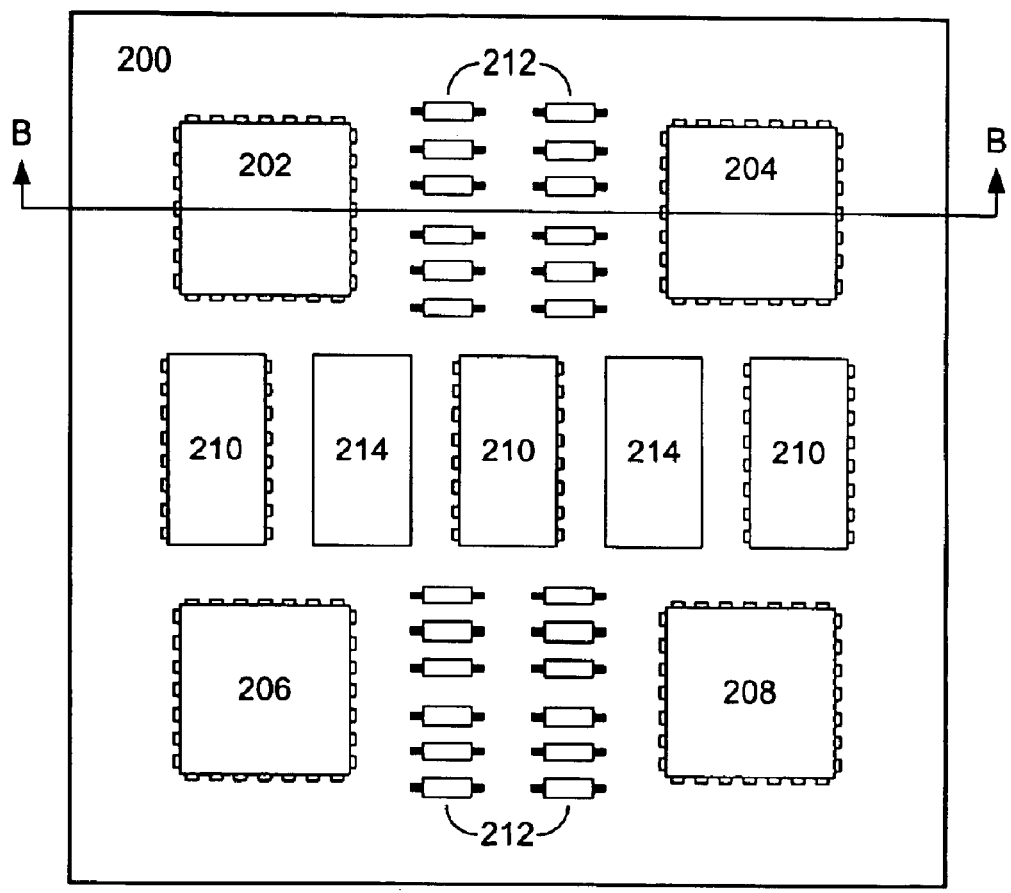
FIG. 2A is a top view of an example embodiment of a second printed circuit board including heat-generating devices according to the present invention.

FIG. 2A is a top view of an example embodiment of a second printed circuit board including heat-generating electronic devices according to the present invention. In this example embodiment of the present invention a second printed circuit board 200 is provided including a second heat-generating device 202, a third heat-generating device 204, a fourth heat-generating device 206, and a fifth heat-generating device 208. Other embodiments of the present invention may include any number of heat-generating devices as needed for a particular implementation of the invention. These heat-generating devices 202, 204, 206, and 208 may include electronic power circuits, application specific integrated circuits (ASICs), microprocessors, discrete electronic devices such as field effect transistors (FETs), other types of transistors, or other heat-generating electronic devices as needed for a particular implementation of the present invention. Also included on this second printed circuit board 200 are a number of other devices 210 that may or may not generate heat, along with a plurality of discrete devices 212, (such as resistors, capacitors, transistors, and diodes, for example) that also may or may not generate heat. Those of skill in the art will recognize that any of the printed circuit boards may include discrete devices 212, or other heat-generating devices that are not directly coupled with the heat sink.

Optionally, thermal pads 214 may be placed on the printed circuit board that are thermally coupled to the discrete devices 212 and these thermal pads 214 may then be contacted by a heat sink to remove heat from the discrete devices 212. Optionally, one or more of the heat-generating devices 202, 204, 206, and 208 may be thermally coupled to the thermal pads 214. In some embodiments of the present invention these pads 214 may be standard copper printed circuit board pads. This optional embodiment of the present invention is shown and described in FIGS. 8A and 8B.

Figure 2B:
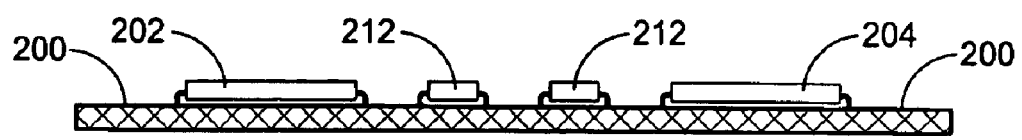
FIG. 2B is a cross-sectional view of the example embodiment of a second printed circuit board from FIG. 2A along section line B—B.

FIG. 2B is a cross-sectional view of the example embodiment of a second printed circuit board from FIG. 2A along section line B—B. In this example embodiment of the present invention, the second printed circuit board 200 is shown with a second heat-generating device 202, a third heat-generating device 204, and two discrete electronic devices 212.

Figure 3A:
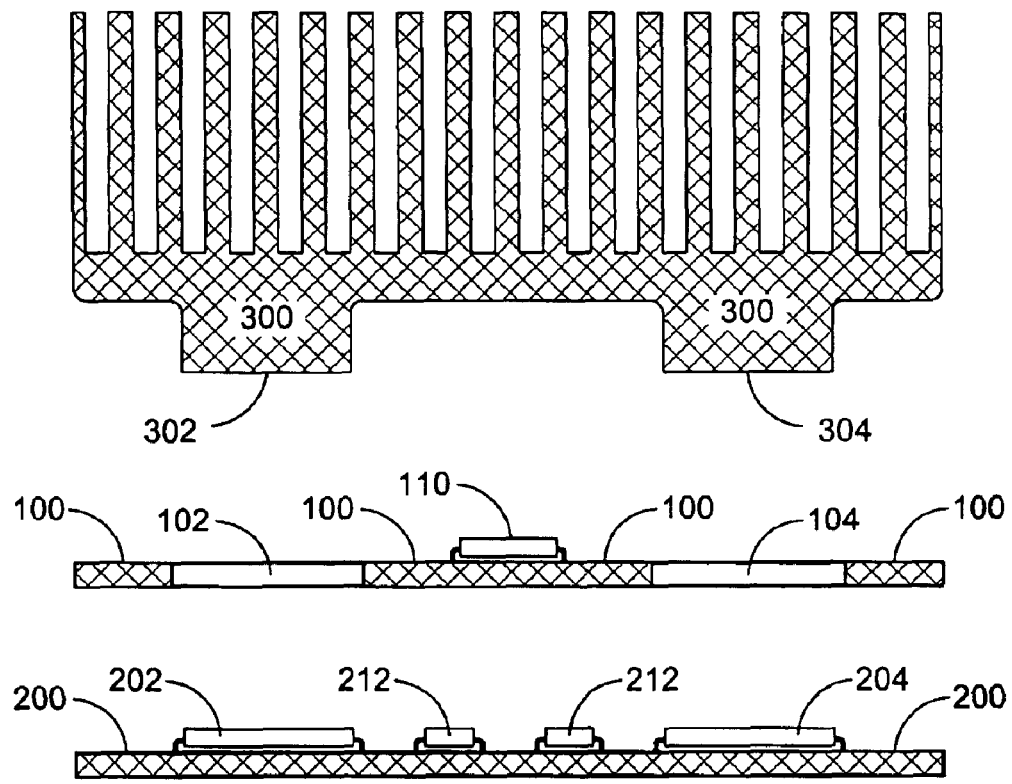
FIG. 3A is a cross-sectional view of an example stack up assembly before assembly of the example embodiments of first and second printed circuit boards from FIGS. 1 and 2 along with an example embodiment of a heat sink according to the present invention.
Figure 3B:
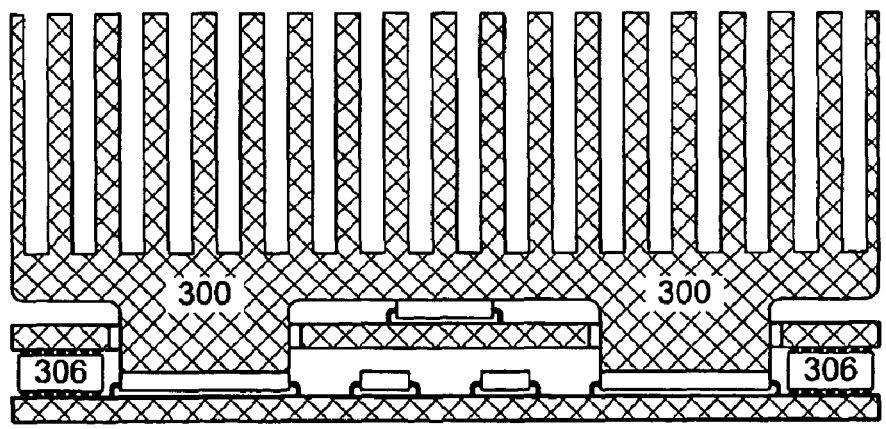
FIG. 3B is a cross-sectional view of an example stack up assembly after complete assembly of the example embodiments of first and second printed circuit boards from FIGS. 1 and 2 along with an example embodiment of a heat sink according to the present invention.

FIG. 3A is a cross-sectional view of an example stack up assembly before assembly of the example embodiments of first and second printed circuit boards from FIGS. 1 and 2 along with an example embodiment of a heat sink according to the present invention. This example embodiment of a stack up according to the present invention includes the first printed circuit board 100 from FIG. 1, the second printed circuit board 200 from FIG. 2, along with an example embodiment of a heat sink 300 according to the present invention. Those of skill in the art will recognize that a wide variety of thermal devices may be used as a heat sink 300. While a standard finned heat sink 300 is shown in FIGS. 3A and 3B, other example embodiments of the present invention may use heat spreaders, cold plates, refrigeration (evaporative cooling) plates, heat pipes, or other thermal devices in place of the finned heat sink shown in these figures. This cross-sectional view of an example stack up shows the first printed circuit board 100 from FIG. 1B and the second printed circuit board 200 from FIG. 2B. In this example embodiment of the present invention, the first printed circuit board 100 is shown with a first opening 102, and a second opening 104. Also shown in this cross-sectional view is one of the first heat-generating devices 110 from FIG. 1A. In this example embodiment of the present invention, the second printed circuit board 200 is shown with a second heat-generating device 202, a third heat-generating device 204, and two discrete devices 212. Note that the heat sink 300 includes a first protrusion 302, and a second protrusion 304 configured to pass through the first opening 102 and the second opening 104 of the first printed circuit board 100 and make contact with the second heat-generating device 202 and the third heat-generating device 204 on the second printed circuit board 200. Those of skill in the art will recognize that there is no requirement that the bottom surfaces of the first protrusion 302 and the second protrusion 304 be co-planar. Note that in some embodiments of the present invention, the heat sink 300 may be a thermal plate, a vapor plate, a heat pipe, or any other thermal device capable of removing heat from the heat-generating devices on the first and second printed circuit boards.

FIG. 3B is a cross-sectional view of an example stack up assembly after complete assembly of the example embodiments of first and second printed circuit boards from FIGS. 1 and 2 along with an example embodiment of a heat sink according to the present invention. After the example stack up shown in FIG. 3A is assembled, the first printed circuit board 100 is mechanically and electrically coupled with the second printed circuit board 200 through one or more electrical connectors 306. These electrical connectors 306 may be configured to set the distance between the first and second printed circuit boards 100, and 200 such that the heat sink 300 makes thermal contact with the first heat-generating devices 110 on the first printed circuit board 100 along with the heat-generating devices 202, and 204 on the second printed circuit board 200. The discrete devices 212 attached to the second printed circuit board 200 in this example embodiment of the present invention are not thermally coupled to the heat sink. Those of skill in the art will recognize that these discrete devices 212 may not require cooling through the heat sink 300 if their heat output is low. Also, there may be some cooling of these devices 212 by air flowing between the first and second printed circuit boards 100, and 200. While this example stack up of the present invention shows two openings 102, and 104 in the first printed circuit board 100 and two heat-generating devices 202, and 204 attached to the second printed circuit board 200, those of skill in the art will recognize that any number of openings in the first printed circuit board 100 may be used to provide heat sink access to any number of heat generating devices on the second printed circuit board 200.

Figure 4A:
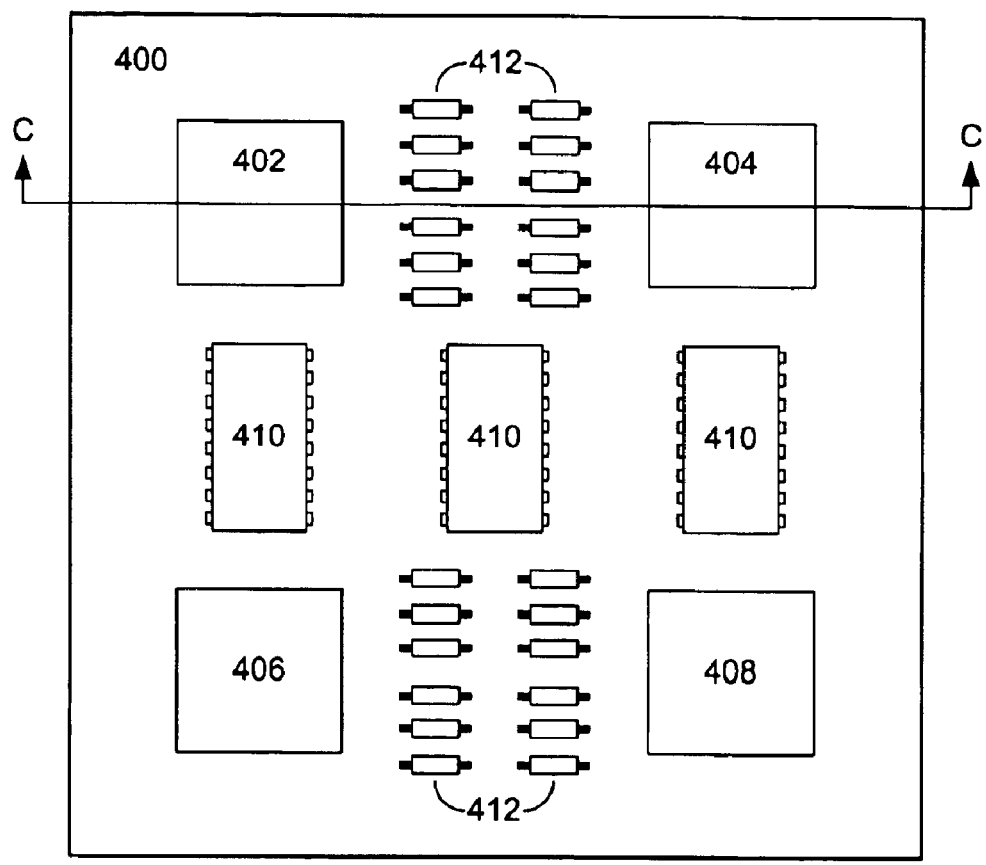
FIG. 4A is a top view of an example embodiment of a second printed circuit board including heat-generating devices according to the present invention.
Figure 4B:
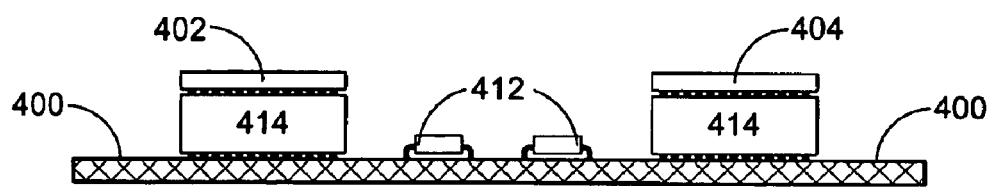
FIG. 4B is a cross-sectional view of the example embodiment of a second printed circuit board from FIG. 4A along section line C—C.

FIG. 4A is a top view of an example embodiment of a second printed circuit board including heat-generating devices according to the present invention. This example embodiment of the present invention is similar to that shown in FIGS. 2A and 2B. However, in this example embodiment of the present invention, the heat-generating devices 402, 404, 406, and 408 are packaged in pin grid array (PGA) packages and supported by interposers 414 attached to the second printed circuit board 400. In this example embodiment of the present invention a second printed circuit board 400 is provided including a second heat-generating device 402, a third heat-generating device 404, a fourth heat-generating device 406, and a fifth heat-generating device 408. These heat-generating devices 402, 404, 406, and 408 are mechanically and electrically coupled with the second printed circuit board 400 through interposers 414 that are shown in FIG. 4B. Other embodiments of the present invention may include any number of heat-generating devices as needed for a particular implementation of the invention. These heat-generating devices 402, 404, 406, and 408 may include electronic power circuits, application specific integrated circuits (ASICs), microprocessors, discrete electronic devices such as field effect transistors (FETs), other types of transistors, or other heat-generating devices as needed for a particular implementation of the present invention. Also included on this second printed circuit board 400 are a number of other devices 410 that may or may not generate heat, along with a plurality of discrete devices 412, (such as resistors, capacitors, transistors, and diodes, for example) that also may or may not generate heat.

FIG. 4B is a cross-sectional view of the example embodiment of a second printed circuit board from FIG. 4A along section line C—C. In this example embodiment of the present invention, the second printed circuit board 400 is shown with a second heat-generating device 402, a third heat-generating device 404, and two discrete devices 412. The second and third heat-generating devices 402, and 404 are mechanically and electrically coupled to the second printed circuit board 400 through interposers 414. Note that in some example embodiments of the present invention the interposers 414 may also include a socket configured to allow insertion and removal of the heat-generating devices 402, and 404. Interposers 414 are often used to allow non-permanent electrical and mechanical coupling of electronic devices to a printed circuit board.

FIG. 5A is a cross-sectional view of an example stack up assembly before assembly of the example embodiments of first and second printed circuit boards from FIGS. 1 and 4 along with an example embodiment of a heat sink according to the present invention. This example embodiment of a stack up according to the present invention includes the first printed circuit board 100 from FIG. 1, the second printed circuit board 400 from FIG. 4, along with an example embodiment of a heat sink 500 according to the present invention. In this example embodiment of the present invention, the first printed circuit board 100 is shown with a first opening 102, and a second opening 104. Also shown in this cross-sectional view is one of the first heat-generating devices 110 from FIG. 1A. In this example embodiment of the present invention, the second printed circuit board 400 is shown with a second heat-generating device 402, a third heat-generating device 404, two discrete devices 412, and two interposers 414 supporting the second and third heat-generating devices 402, and 404. Note that the heat sink 500 includes a substantially flat bottom surface unlike the heat sink 300 shown in FIG. 3.

FIG. 5B is a cross-sectional view of an example stack up assembly after complete assembly of the example embodiments of first and second printed circuit boards from FIGS. 1 and 4 along with an example embodiment of a heat sink according to the present invention. After the example stack up shown in FIG. 5A is assembled, the first printed circuit board 100 is mechanically and electrically coupled with the second printed circuit board 400 through one or more electrical connectors 502. These electrical connectors 502 may be configured to set the distance between the first and second printed circuit boards 100, and 400 such that the heat sink 500 makes thermal contact with the first heat-generating devices 110 on the first printed circuit board 100 along with the heat-generating devices 402, and 404 on the second printed circuit board 400. Note that the interposers 414 mechanically and electrically coupling the heat-generating electronic devices 402, and 404 to the second printed circuit board 400 are configured to position the heat-generating devices such that their top surfaces are substantially co-planar with each other and the heat-generating devices 110 attached to the first printed circuit board 100. This allows the use of a single heat sink 500 with a substantially planar bottom surface to contact all of the heat-generating devices 110, 402, and 404 on the first and second printed circuit boards 100, and 400 that the designer desires to be thermally coupled to the heat sink 500. The discrete devices 412 attached to the second printed circuit board 400 in this example embodiment of the present invention are not thermally coupled to the heat sink. Those of skill in the art will recognize that these discrete devices 412 may not require cooling through the heat sink 500 if their heat output is low. Also, there may be some cooling of these devices 412 by air flowing between the first and second printed circuit boards 100, and 400. While this example stack up of the present invention shows two openings 102, and 104 in the first printed circuit board 100 and two heat-generating devices 402, and 404 attached to the second printed circuit board 400, those of skill in the art will recognize that any number of openings in the first printed circuit board 100 may be used to provide heat sink access to any number of heat-generating devices on the second printed circuit board 400.

Figure 6:
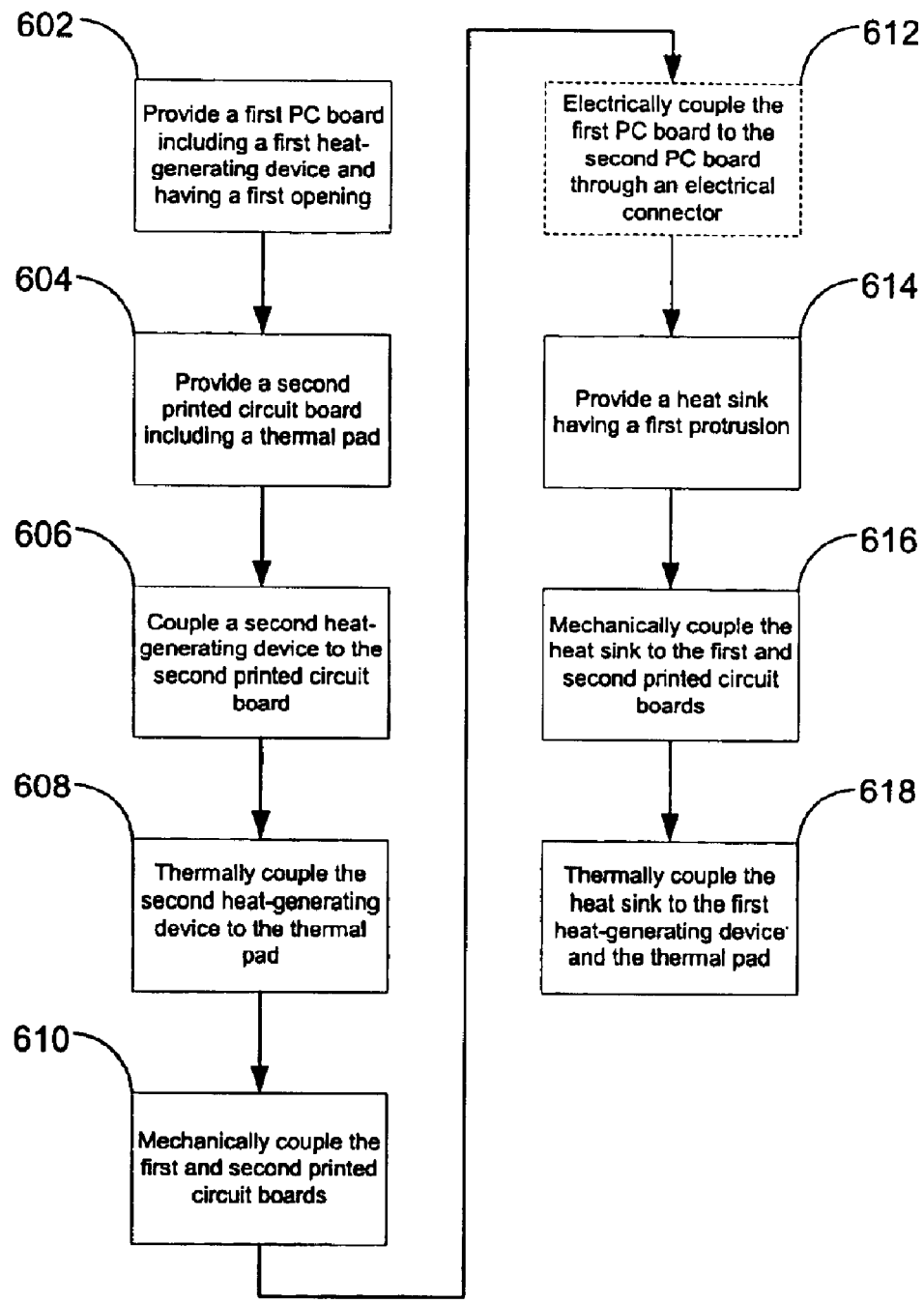
FIG. 6 is a flow chart of an example method for the construction of a stack up including first and second printed circuit boards cooled by a single heat sink according to the present invention.

FIG. 6 is a flow chart of an example method for the construction of a stack up including first and second printed circuit boards cooled by a single heat sink according to the present invention. In a step 602, a first printed circuit board including a first heat-generating device and having a first opening is provided. In a step 604, a second printed circuit board including a thermal pad is provided. In a step 606, a second heat-generating device is electrically and mechanically coupled to the second printed circuit board. In a step 608, the second heat-generating device is thermally coupled to the thermal pad. In a step 610, the first and second printed circuit boards are mechanically coupled. In an optional step 612, the first and second printed circuit boards are electrically coupled through an electrical connector. In a step 614, a heat sink having a first protrusion is provided. In a step 616, the heat sink is mechanically coupled to the first and second printed circuit boards. In a step 618, the heat sink is thermally coupled to the first heat-generating device and the thermal pad.

Figure 7A:
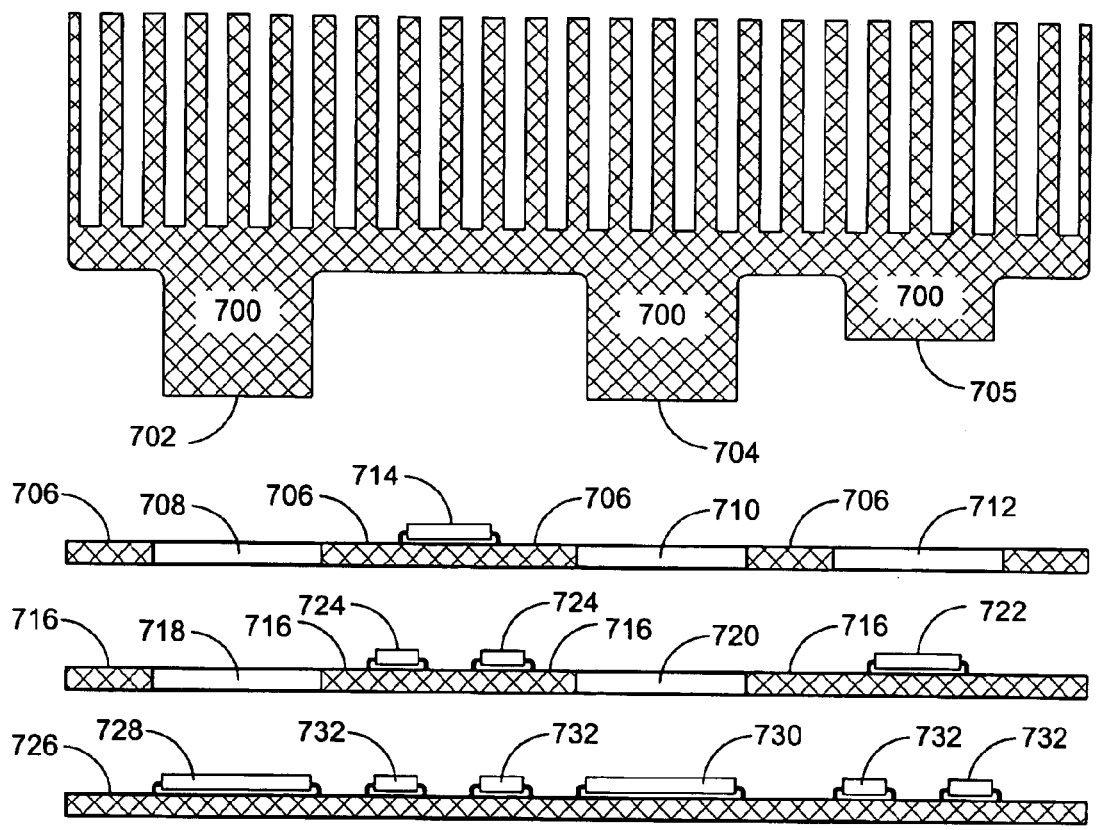
FIG. 7A is a cross-sectional view of an example stack up assembly before assembly of an example embodiment of the present invention including a total of three printed circuit boards and a heat sink.

FIG. 7A is a cross-sectional view of an example stack up assembly before assembly of an example embodiment of the present invention including a total of three printed circuit boards and a heat sink. This example embodiment of a stack up according to the present invention includes a first printed circuit board 706 similar to that shown in FIG. 1, a second printed circuit board 716 similar to that shown in FIG. 1, and a third printed circuit board 726 similar to that shown in FIG. 4, along with an example embodiment of a heat sink 700 according to the present invention. In this example embodiment of the present invention, the first printed circuit board 706 is shown with a first opening 708, a second opening 710, and a third opening 712. Also shown in this cross-sectional view is a first heat-generating device 714. In this example embodiment of the present invention, the second printed circuit board 716 is shown with a second heat-generating device 722, and two discrete devices 724. The third printed circuit board 726, includes a third heat-generating device 728, a fourth heat-generating device 730, and some discrete devices 732. The heat sink 700 includes a first protrusion 702, a second protrusion 704, and a third protrusion 705. Note that the third protrusion 705 is shorter than the first and second protrusions 702, and 704 allowing the third protrusion 705 to make contact with an upper surface of the second heat-generating device 722 on the second printed circuit board 716 after assembly. The first protrusion 702 is configured to contact an upper surface of the third heat-generating device 728 on the third printed circuit board 726 after assembly. The second protrusion 704 is configured to contact an upper surface of the fourth heat-generating device 730 on the third printed circuit board 726 after assembly.

Figure 7B:
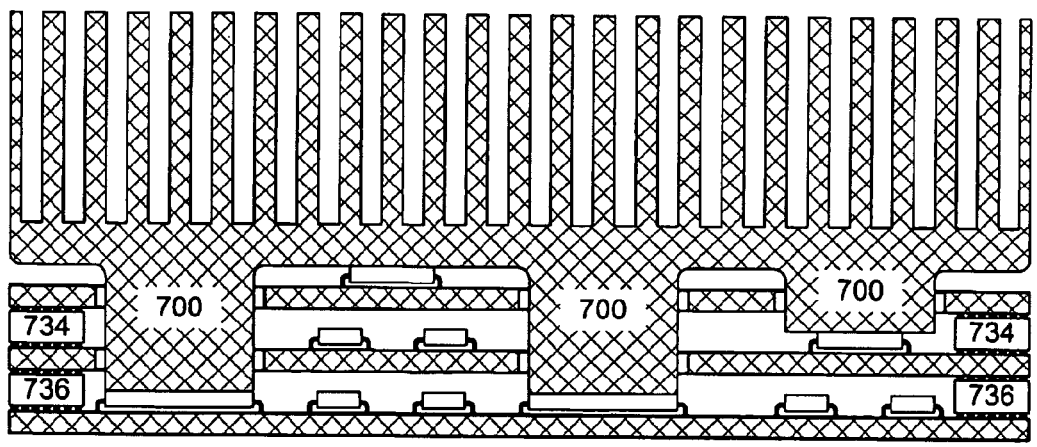
FIG. 7B is a cross-sectional view of an example stack up assembly after complete assembly of the example embodiment of the present invention from FIG. 7A.

FIG. 7B is a cross-sectional view of an example stack up assembly after complete assembly of the example embodiment of the present invention from FIG. 7A. After the example stack up shown in FIG. 7A is assembled, the first printed circuit board 706 is mechanically and electrically coupled with the second printed circuit board 716 through one or more electrical connectors 734, and the second printed circuit board 716 is mechanically and electrically coupled with the third printed circuit board 726 through one or more electrical connectors 736. These electrical connectors 734, and 736 may be configured to set the distance between the printed circuit boards 706, 716, and 726 such that the heat sink 700 makes thermal contact with the first heat-generating device 714 on the first printed circuit board 706, the second heat-generating device 722 on the second printed circuit board 716, along with the heat-generating devices 728, and 730 on the third printed circuit board 726. The discrete devices 732 attached to the third printed circuit board 726 in this example embodiment of the present invention are not thermally coupled to the heat sink. Those of skill in the art will recognize that these discrete devices 732 may not require cooling through the heat sink 700 if their heat output is low. Also, there may be some cooling of these devices 732 by air flowing between the second and third printed circuit boards 716, and 726. Other embodiments of the present invention may thermally couple one or more of the discrete devices 732 through the third and fourth heat-generating devices 728, and 730 to the heat sink 700. While this example stack up of the present invention shows three openings 708, 710, and 712 in the first printed circuit board 706 and two heat-generating devices 728, and 730 attached to the third printed circuit board 726, those of skill in the art will recognize that any number of openings in the first printed circuit board 706 may be used to provide heat sink access to any number of heat generating devices on the second printed circuit board 716, and the third printed circuit board 726. Those of skill in the art will recognize that any number of printed circuit boards may be stacked up within the scope of the present invention.

Figure 8A:
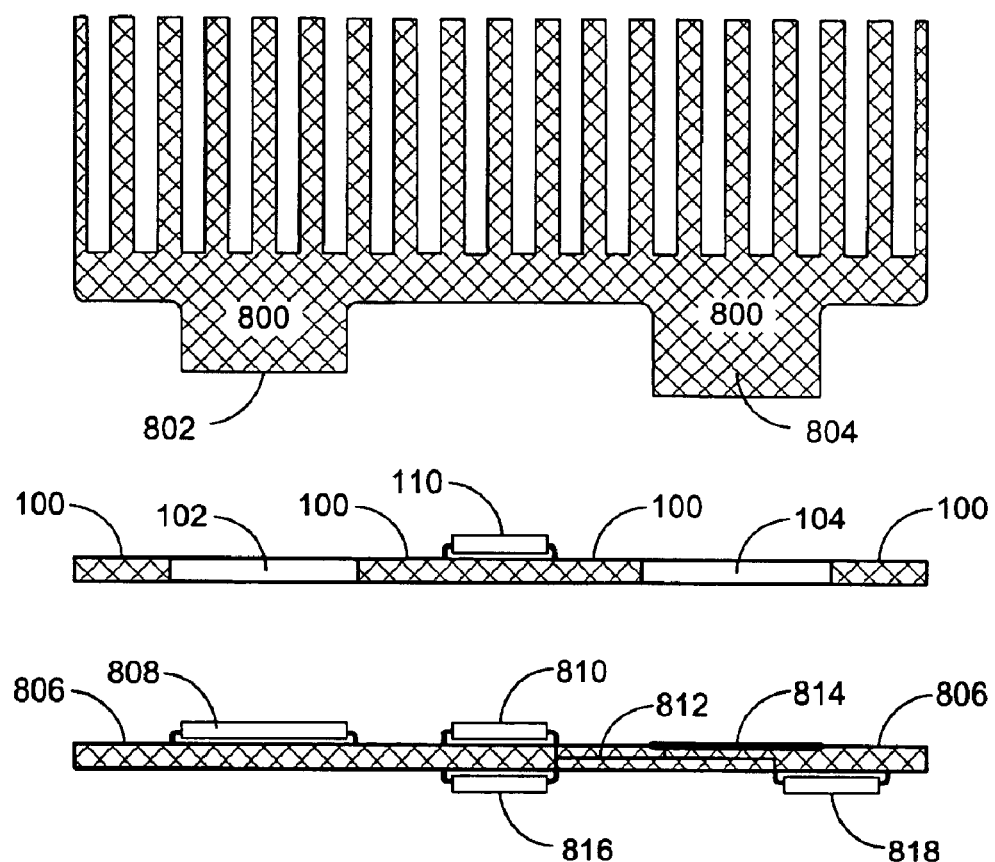
FIG. 8A is a cross-sectional view of an example stack up assembly before assembly of an example embodiment of the present invention including a printed circuit board with heat-generating devices on both sides.
Figure 8B:
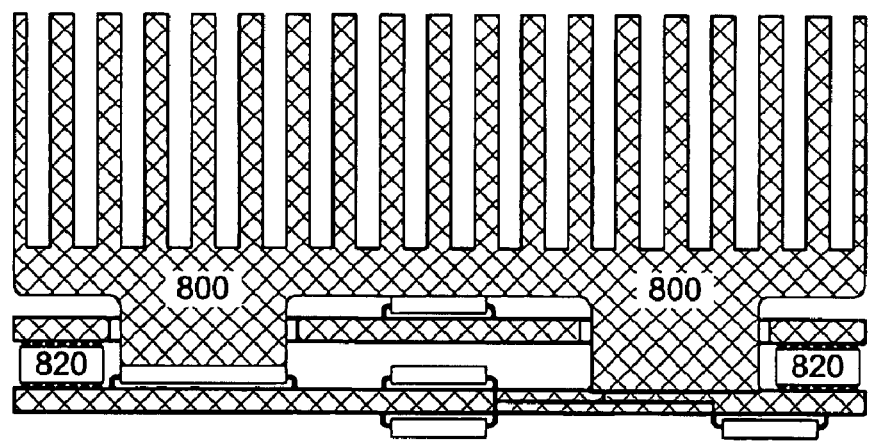
FIG. 8B is a cross-sectional view of an example stack up assembly after complete assembly of the example embodiment of the present invention from FIG. 8A.

FIG. 8A is a cross-sectional view of an example stack up assembly before assembly of an example embodiment of the present invention including a printed circuit board with heat-generating devices on both sides. This example embodiment of a stack up according to the present invention includes the first printed circuit board 100 from FIG. 1, an second printed circuit board 806 including heat-generating devices on both sides of the PC board 806, along with an example embodiment of a heat sink 800 according to the present invention. Those of skill in the art will recognize that a wide variety of thermal devices may be used as a heat sink 800. While a standard finned heat sink 800 is shown in FIGS. 8A and 8B, other example embodiments of the present invention may use heat spreaders, cold plates, refrigeration (evaporative cooling) plates, heat pipes, or other thermal devices in place of the finned heat sink shown in these figures. In this example embodiment of the present invention, the first printed circuit board 100 is shown with a first opening 102, and a second opening 104. Also shown in this cross-sectional view is one of the first heat-generating devices 110 from FIG. 1A. In this example embodiment of the present invention, a second printed circuit board 806 is shown with a second heat-generating device 808, a third heat-generating device 810, a fourth heat-generating device 816, and a fifth heat-generating device 818. The third, forth and fifth heat-generating devices 810, 816, and 818 are thermally coupled with a thermal pad 814 through a thermal trace 812 within the second printed circuit board 806. In the example embodiment of the present invention shown in FIGS. 8A and 8B, the thermal pad is an area of copper printed circuit board that is thermally connected to the heat generating devices through copper traces on and within the second printed circuit board 806. Some embodiments of the present invention may use one or more ground planes within the second printed circuit board 806 as a thermal trace 812 coupled with a thermal pad 814 comprised of an area of copper on the surface of the second printed circuit board 806 coupled to the ground planes. Other embodiments of the present invention may use other materials for the thermal pad 814, and other methods of thermally coupling the heat-generating devices with the thermal pad 814 within the scope of the present invention. Note that the heat sink 800 includes a first protrusion 802, and a second protrusion 804 configured to pass through the first opening 102 and the second opening 104 of the first printed circuit board 100 and make contact with the second heat-generating device 808 and the thermal pad 814 on the second printed circuit board 806. Those of skill in the art will recognize that there is no requirement that the bottom surfaces of the first protrusion 802 and the second protrusion 804 are co-planar, and they are not co-planar in this example embodiment of the present invention. Note that in some embodiments of the present invention, the heat sink 800 may be a thermal plate, a vapor plate, a heat pipe, or any other thermal device capable of removing heat from the heat-generating devices on the first and second printed circuit boards.

FIG. 8B is a cross-sectional view of an example stack up assembly after complete assembly of the example embodiment of the present invention from FIG. 8A. After the example stack up shown in FIG. 8A is assembled, the first printed circuit board 100 is mechanically and electrically coupled with the second printed circuit board 806 through one or more electrical connectors 820. These electrical connectors 820 may be configured to set the distance between the first and second printed circuit boards 100, and 806 such that the heat sink 800 makes thermal contact with the first heat-generating devices 110 on the first printed circuit board 100 along with the heat-generating device 808, and thermal pad 814 on the second printed circuit board 806.

Figure 9A:
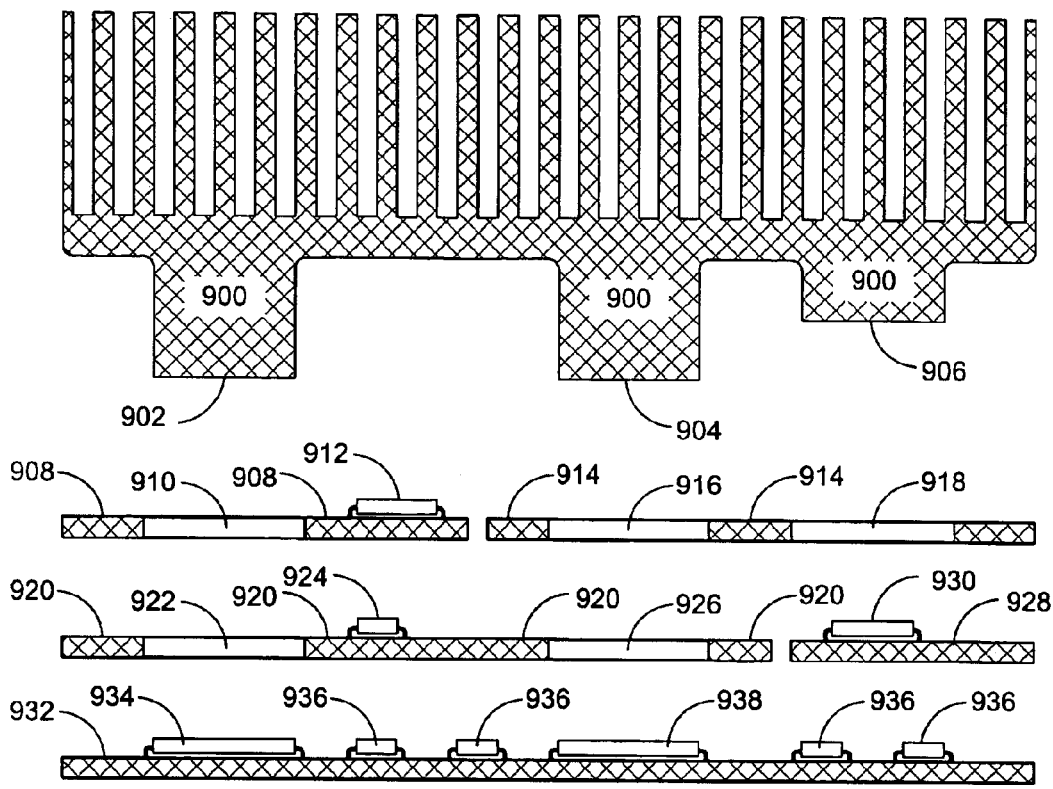
FIG. 9A is a cross-sectional view of an example stack up assembly before assembly of an example embodiment of the present invention including a total of five printed circuit boards and a heat sink.

FIG. 9A is a cross-sectional view of an example stack up assembly before assembly of an example embodiment of the present invention including a total of five printed circuit boards and a heat sink 900. This example embodiment of a stack up according to the present invention includes a first printed circuit board 908, a second printed circuit board 914, a third printed circuit board 920, a fourth printed circuit board 928, a fifth printed circuit board 932, along with an example embodiment of a heat sink 900 according to the present invention. In this example embodiment of the present invention, the first printed circuit board 908 is shown with a first opening 910, and a first heat-generating device 912. In this example embodiment of the present invention, the second printed circuit board 914 is shown with a second opening 916, and a third opening 918. The third printed circuit board 920, includes a discrete device 924, and a fourth opening 922. The fourth printed circuit board 928 includes a second heat-generating device 930. The fifth printed circuit board 932, includes a third heat-generating device 934, a fourth heat-generating device 938, and a plurality of discrete devices 936. The heat sink 900 includes a first protrusion 902, a second protrusion 904, and a third protrusion 906. Note that the third protrusion 906 is shorter than the first and second protrusions 902, and 904 allowing the third protrusion 906 to make contact with an upper surface of the second heat-generating device 930 on the forth printed circuit board 928 after assembly. The first protrusion 902 is configured to contact an upper surface of the third heat-generating device 934 on the fifth printed circuit board 932 after assembly. The second protrusion 904 is configured to contact an upper surface of the fourth heat-generating device 938 on the fifth printed circuit board 932 after assembly.

Figure 9B:
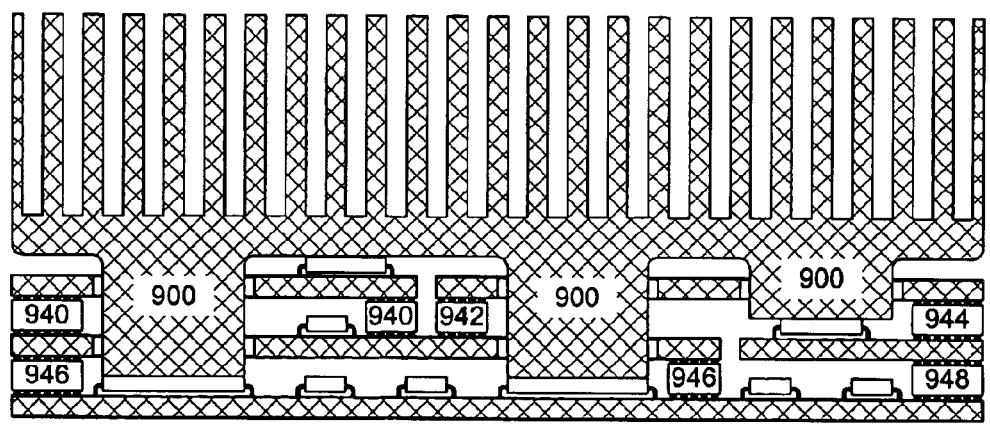
FIG. 9B is a cross-sectional view of an example stack up assembly after complete assembly of the example embodiment of the present invention from FIG. 9A.

FIG. 9B is a cross-sectional view of an example stack up assembly after complete assembly of the example embodiment of the present invention from FIG. 9A. After the example stack up shown in FIG. 9A is assembled, the first printed circuit board 908 is mechanically and electrically coupled with the third printed circuit board 920 through one or more electrical connectors 940. The second printed circuit board 914 is mechanically and electrically coupled with the third printed circuit board 920 through one or more electrical connectors 942, and is also mechanically and electrically coupled with the fourth printed circuit board 928 through one or more electrical connectors 944. The third printed circuit board 920 is mechanically and electrically coupled with the fifth printed circuit board 932 through one or more electrical connectors 946. The fourth printed circuit board 928 is mechanically and electrically coupled with the fifth printed circuit board 932 through one or more electrical connectors 948. The electrical connectors 940, 942, 944, 946, and 948 may be configured to set the distance between the printed circuit boards 908, 914, 920, 928, and 932 such that the heat sink 900 makes thermal contact with the first heat-generating device 912 on the first printed circuit board 908, the second heat-generating device 930 on the fourth printed circuit board 928, along with the heat-generating devices 934, and 938 on the fifth printed circuit board 932. The discrete devices 936 attached to the fifth printed circuit board 932 in this example embodiment of the present invention are not thermally coupled to the heat sink. Those of skill in the art will recognize that these discrete devices 936 may not require cooling through the heat sink 900 if their heat output is low. Also, there may be some cooling of these devices 936 by air flowing between the third, fourth, and fifth printed circuit boards 920, 928, and 932. Other embodiments of the present invention may thermally couple one or more of the discrete devices 936 through the third and fourth heat-generating devices 934, and 938 to the heat sink 900. While this example stack up of the present invention shows one opening 910 in the first printed circuit board 908, two openings 916, and 918 in the second printed circuit board 914, two openings 922, and 926 in the third printed circuit board 920, and two heat-generating devices 934, and 938 attached to the fifth printed circuit board 932, those of skill in the art will recognize that any combination of openings and heat generating devices may be used within the scope of the present invention. Those of skill in the art will recognize that any number of printed circuit boards may be stacked up within the scope of the present invention.

Figure 10A:
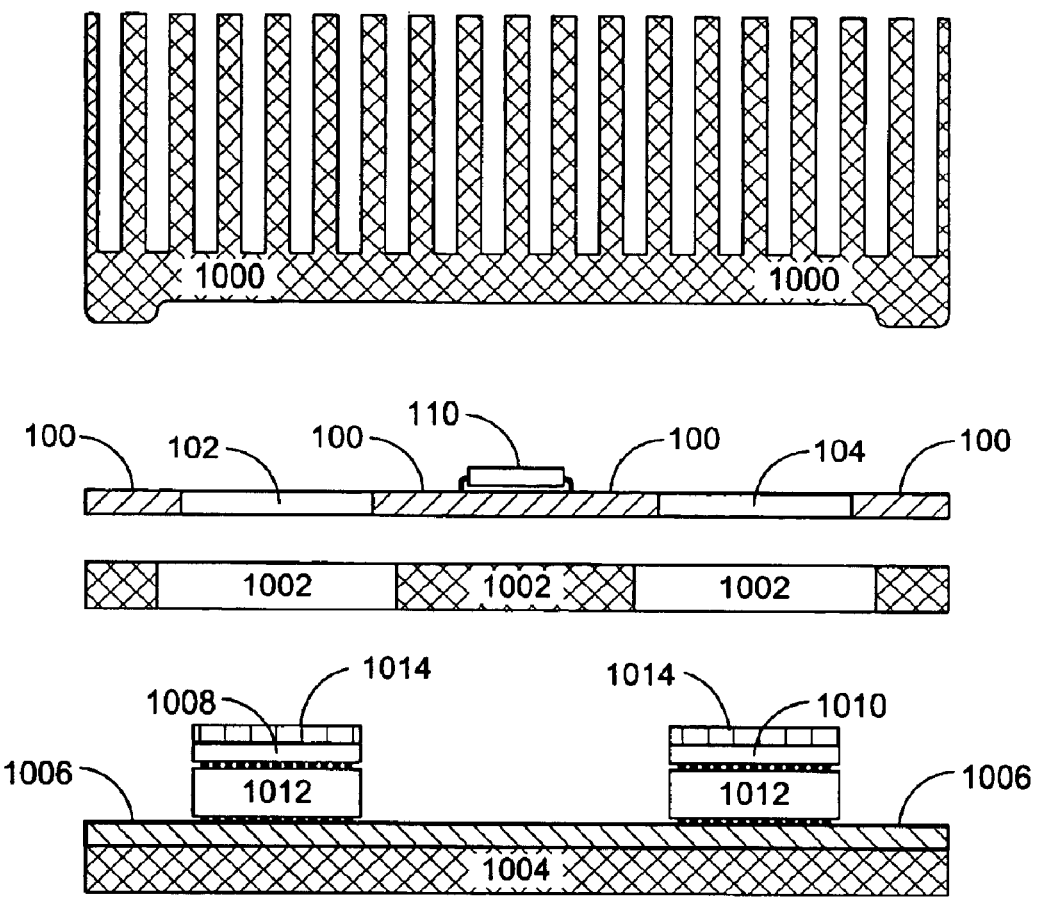
FIG. 10A is a cross-sectional view of an example stack up assembly before assembly of an example embodiment of the present invention as shown in FIG. 5A along with gap-filling thermal interfaces between the heat-generating devices and the heat sink.

FIG. 10A is a cross-sectional view of an example stack up assembly before assembly of an example embodiment of the present invention as shown in FIG. 5A along with gap-filling thermal interfaces between the heat-generating devices and the heat sink. This example embodiment of a stack up according to the present invention includes the first printed circuit board 100 from FIG. 1, a second printed circuit board 1006 similar to the printed circuit board shown in FIG. 4, along with an example embodiment of a heat sink 1000 according to the present invention. Also, the stack up includes a middle frame 1002 and a lower frame 1004. The heat sink 1000, middle frame 1002, and the lower frame 1004 may be mechanically coupled to each other and the two printed circuit boards 100, and 1006 to provide for mechanical stability, electrical coupling, and thermal coupling of the devices within the module. Also, if the heat sink 1000, middle frame 1002, and lower frame 1004 are metal, the combination acts as an electromagnetic interference (EMI) shield protecting electronic devices within the module from EMI existing outside the module and also to prevent EMI generated within the module from leaving the module. Thus, the heat sink 1000, middle frame 1002, and lower frame 1004 may act as a faraday cage. In this example embodiment of the present invention, the first printed circuit board 100 is shown with a first opening 102, and a second opening 104. Also shown in this cross-sectional view is one of the first heat-generating devices 110 from FIG. 1A. In this example embodiment of the present invention, the second printed circuit board 1006 is shown with a second heat-generating device 1008, a third heat-generating device 1010, and two interposers 1012 supporting the second and third heat-generating devices 1008, and 1010. Also included in this example embodiment are gap-filling thermal interfaces 1014 on top of the heat-generating devices 1008, and 1010. Upon assembly these gap-filling thermal interfaces 1014 will provide thermal contact between the heat-generating devices 1008, and 1010 and the heat sink 1000. These gap-filling thermal interfaces 1014 may be thermal paste, thermal pads, elastomeric thermal material, or any other thermally conducting material suitable to conform to the upper surface of the heat-generating devices 1008, and 1010, and the lower surface of the heat sink 1000, thus providing for greater thermal coupling between the heat-generating devices 1008, and 1010 and the heat sink 1000 than would be provided without the gap-filling thermal interfaces 1014. While this example embodiment shows the gap-filling-thermal interfaces 1014 positioned on top of the heat-generating devices 1008, and 1010 prior to assembly, those of skill in the art will recognize that the gap-filling thermal interfaces 1014 could also be positioned on the lower surface of the heat sink 1000 prior to assembly within the scope of the present invention.

Figure 10B:
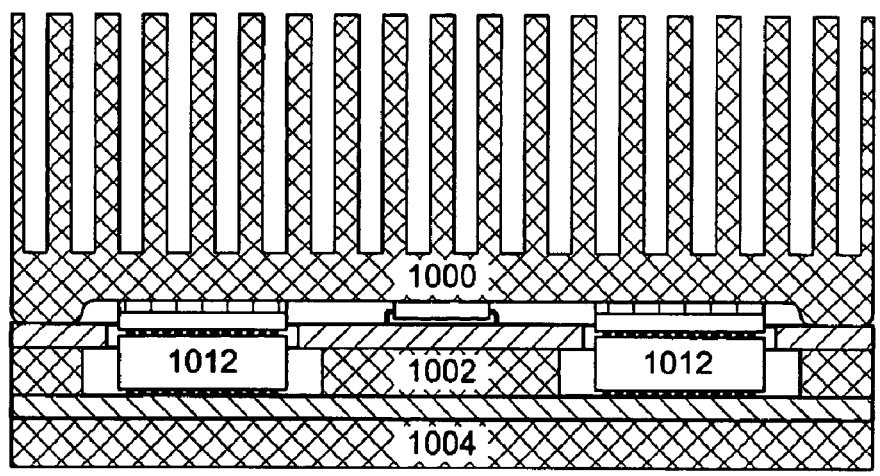
FIG. 10B is a cross-sectional view of an example stack up assembly after complete assembly of the example embodiment of the present invention as shown in FIG. 10A.

FIG. 10B is a cross-sectional view of an example stack up assembly after complete assembly of the example embodiment of the present invention as shown in FIG. 10A. After the example stack up shown in FIG. 10A is assembled, the first printed circuit board 100 is mechanically coupled with the second printed circuit board 1006 through the middle frame 1002. This middle frame 1002 may act as a positioning device configured to set the distance between the first and second printed circuit boards 100, and 1006 such that the heat sink 1000 makes thermal contact with the first heat-generating devices 110 on the first printed circuit board 100 along with the heat-generating devices 1008, and 1010 on the second printed circuit board 1006. Note that the interposers 1012 mechanically and electrically coupling the heat-generating electronic devices 1008, and 1010 to the second printed circuit board 1006 are configured to position the heat-generating devices such that their top surfaces, including any gap-filling thermal interfaces 1014, are substantially co-planar with each other and the heat-generating devices 110 attached to the first printed circuit board 100. This allows the use of a single heat sink 1000 with a substantially planar bottom surface to contact all of the heat-generating devices 110, 1008, and 1010 on the first and second printed circuit boards 100, and 1006 that the designer desires to be thermally coupled to the heat sink 1000. While this example stack up of the present invention shows two openings 102, and 104 in the first printed circuit board 100 and two heat-generating devices 1008, and 1010 attached to the second printed circuit board 1006, those of skill in the art will recognize that any number of openings in the first printed circuit board 100 may be used to provide heat sink access to any number of heat-generating devices on the second printed circuit board 1006.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An assembly, comprising:
   a first printed circuit board having a first opening, a second opening, and including a first heat-generating device;
      a second printed circuit board mechanically coupled to said first printed circuit board;
      a second heat-generating device;
   a first interposer configured to mechanically and electrically couple said second heat-generating device to said second printed circuit board;
   a third heat-generating device;
   a thermal pad on a surface of said second printed circuit board substantially aligned with said second opening in said first printed circuit board; and
   a heat sink mechanically coupled with said first and second printed circuit boards,
      wherein said heat sink is thermally coupled with said second heat-generating device, said first heat-generating device on said first printed circuit board, and said thermal pad.

2. The assembly of claim 1, wherein said first interposer is of sufficient height such that said second heat-generating device extends through said first opening in said first printed circuit board, and an upper surface of said second heat-generating device is substantially coplanar with an upper surface of said first heat-generating device on said first printed circuit board.

3. The assembly of claim 1, wherein said first heat-generating device is an ASIC.

4. The assembly of claim 1, wherein said first heat-generating device is a microprocessor.

5. The assembly of claim 1, wherein sand first heat-generating device is a FET.

6. The assembly of claim 1, wherein said second heat-generating device is an ASIC.

7. The assembly of claim 1, wherein said second heat-generating device is a microprocessor.

8. The assembly of claim 1, wherein said second heat-generating device is a FET.

9. The assembly of claim 1, wherein said third heat-generating device is an ASIC.

10. The assembly of claim 1. wherein said third heat-generating device is a microprocessor.

11. The assembly of claim 1, wherein said third heat-generating device is a FET.

12. The assembly of claim 1, wherein said first printed circuit board including a first heat-generating device is a power module.

13. The assembly of claim 1, wherein said second printed circuit board including a second heat-generating device is a power module.

14. The assembly of claim 1, wherein said first printed circuit board is a voltage regulation module (VRM) circuit board.

15. The assembly of claim 1, wherein said second printed circuit board is a voltage regulation module (VRM) circuit board.

16. The assembly of claim 1, further comprising:
an electrical connector configured to electrically couple said first printed circuit board to said second printed circuit board.

* * * * *